(12) United States Patent
Palm et al.

(10) Patent No.: US 10,818,646 B2
(45) Date of Patent: Oct. 27, 2020

(54) POWER STAGE DEVICE WITH CARRIER FRAME FOR POWER STAGE MODULE AND INTEGRATED INDUCTOR

(71) Applicant: Infineon Technologies AG, Neubiberg (DE)

(72) Inventors: Petteri Palm, Regensburg (DE); Eung San Cho, Torrance, CA (US)

(73) Assignee: Infineon Technologies AG, Neubiberg (DE)

( * ) Notice: Subject to any disclaimer, the term of this patent is extended or adjusted under 35 U.S.C. 154(b) by 74 days.

(21) Appl. No.: 16/274,776

(22) Filed: Feb. 13, 2019

(65) Prior Publication Data

US 2020/0258873 A1 Aug. 13, 2020

(51) Int. Cl.
  *H01L 23/498* (2006.01)
  *H01L 25/16* (2006.01)
  *H05K 1/11* (2006.01)
  *H05K 1/14* (2006.01)
  *H05K 1/09* (2006.01)
  (Continued)

(52) U.S. Cl.
  CPC .......... *H01L 25/16* (2013.01); *H01L 21/4853* (2013.01); *H01L 21/565* (2013.01); *H01L 21/568* (2013.01); *H01L 23/3121* (2013.01); *H01L 23/49861* (2013.01); *H01L 23/5383* (2013.01); *H01L 23/5389* (2013.01); *H05K 1/09* (2013.01); *H05K 1/111* (2013.01); *H05K 1/115* (2013.01); *H05K 1/144* (2013.01); *H05K 1/181* (2013.01); *H05K 1/185* (2013.01); *H05K 3/007* (2013.01); *H05K 3/303* (2013.01); *H05K 3/36* (2013.01); *H02M 3/158* (2013.01); *H05K 2201/042* (2013.01); *H05K 2201/1003* (2013.01); *H05K 2201/10015* (2013.01);
  (Continued)

(58) Field of Classification Search
  CPC ... H05K 1/09; H05K 1/11; H05K 1/14; H05K 1/141–144; H05K 1/181–185; H01L 21/565; H01L 21/568; H01L 21/4853; H01L 25/16; H01L 23/3121; H01L 23/49861; H01L 23/5385; H01L 23/5389
  USPC ......................................... 361/760–784, 803
  See application file for complete search history.

(56) References Cited

U.S. PATENT DOCUMENTS 7,978,031 B2 * 7/2011 Goi ........................ H04B 1/03
                                                                    333/247
9,640,474 B1 * 5/2017 Cho ..................... H01L 21/4821
(Continued)

*Primary Examiner* — Tuan T Dinh
(74) *Attorney, Agent, or Firm* — Murphy, Bilak & Homiller, PLLC

(57) ABSTRACT

A power device includes a frame having an electrically insulative material, an opening in the electrically insulative material, and an electrical conductor extending through the electrically insulative material. A power stage module fixed in the opening has an output terminal at a first side of the power stage module, and a power terminal, a ground terminal and a plurality of input/output (I/O) terminals at a second side of the power stage module opposite the first side. A passive component has a first terminal attached to the output terminal of the power stage module and a second terminal attached to the electrical conductor of the frame. The passive component has a larger footprint than the power stage module. The frame expands the footprint of the power stage module to accommodate mounting of the passive component to the power device. The frame has a lower interconnect density than the power stage module.

20 Claims, 13 Drawing Sheets

(51) Int. Cl.

| | |
|---|---|
| *H05K 3/30* | (2006.01) |
| *H05K 3/36* | (2006.01) |
| *H01L 23/538* | (2006.01) |
| *H01L 23/31* | (2006.01) |
| *H05K 3/00* | (2006.01) |
| *H01L 21/48* | (2006.01) |
| *H01L 21/56* | (2006.01) |
| *H05K 1/18* | (2006.01) |
| *H02M 3/158* | (2006.01) |

(52) U.S. Cl.
 CPC .............. *H05K 2201/10166* (2013.01); *H05K 2201/10378* (2013.01); *H05K 2201/10416* (2013.01)

(56) References Cited

U.S. PATENT DOCUMENTS

| | | | |
|---|---|---|---|
| 10,504,848 B1* | 12/2019 | Parto | ................. H01L 24/19 |
| 2009/0315162 A1 | 12/2009 | Liu et al. | |
| 2011/0157857 A1* | 6/2011 | Matsumoto | .......... H05K 1/0224 361/803 |
| 2016/0104665 A1* | 4/2016 | Cho | ................ H01L 23/3114 257/666 |
| 2017/0125324 A1 | 5/2017 | Joshi et al. | |
| 2017/0223835 A1 | 8/2017 | Lu et al. | |
| 2017/0325333 A1 | 11/2017 | Yin et al. | |
| 2018/0053755 A1 | 2/2018 | Cho et al. | |
| 2018/0054119 A1 | 2/2018 | Cho et al. | |
| 2018/0122745 A1* | 5/2018 | Cho | ................ H01L 21/486 |

* cited by examiner

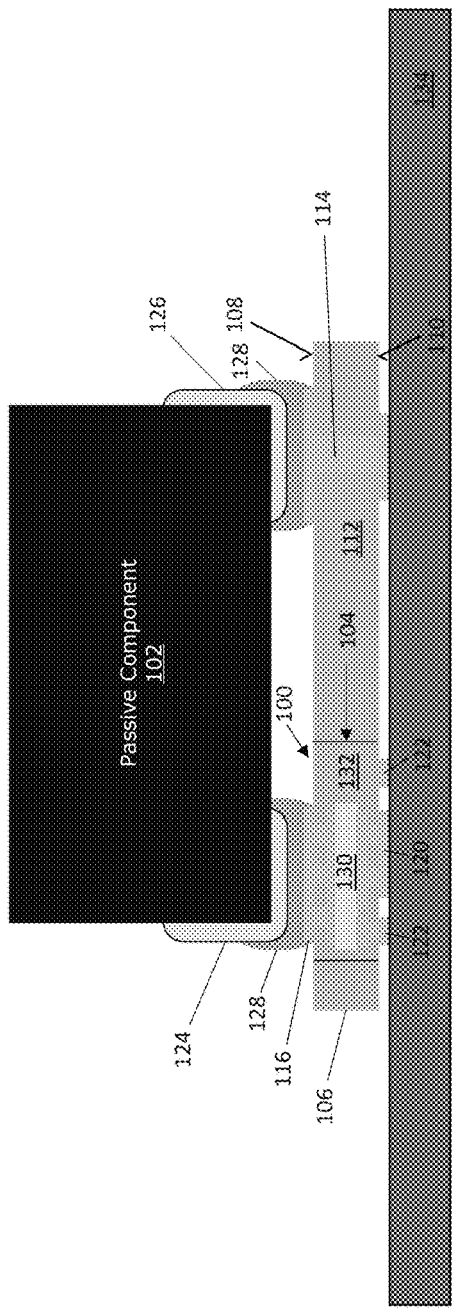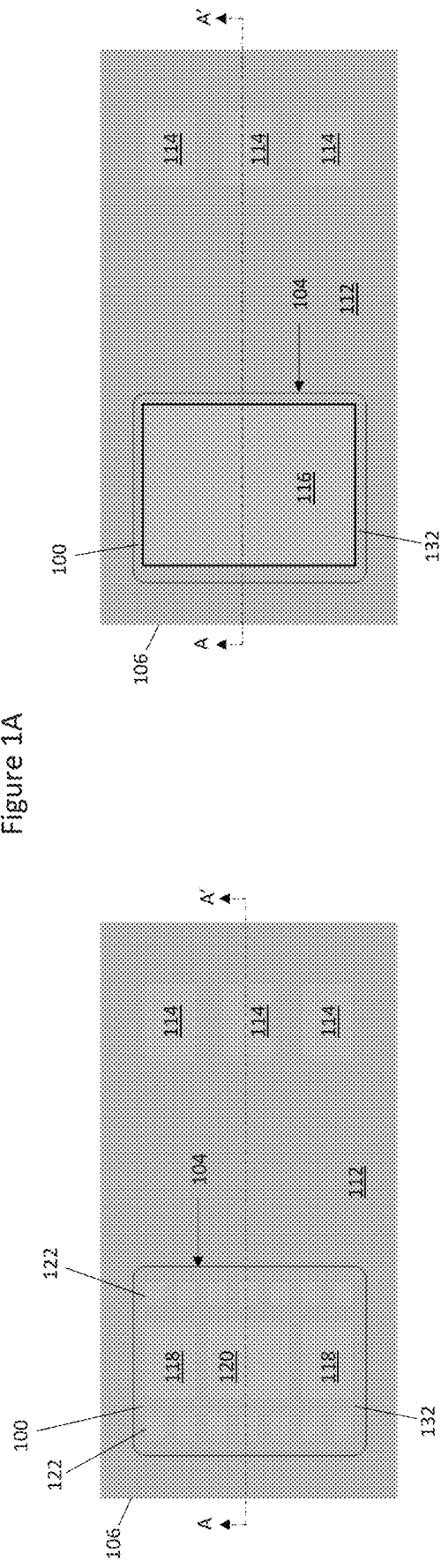
Figure 1A
Figure 1B
Figure 1C

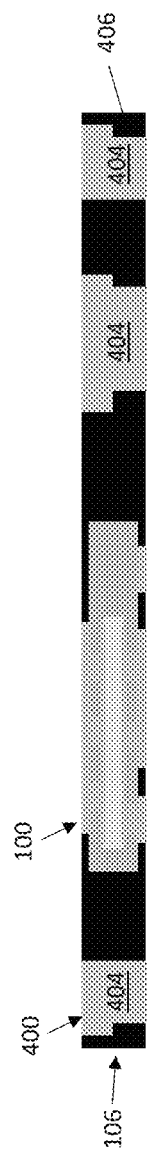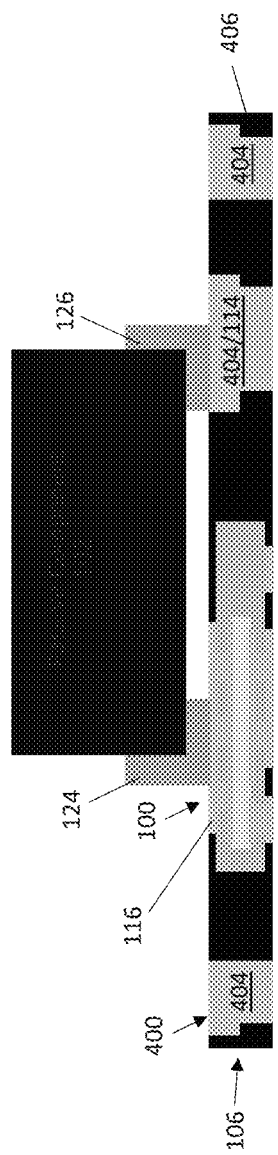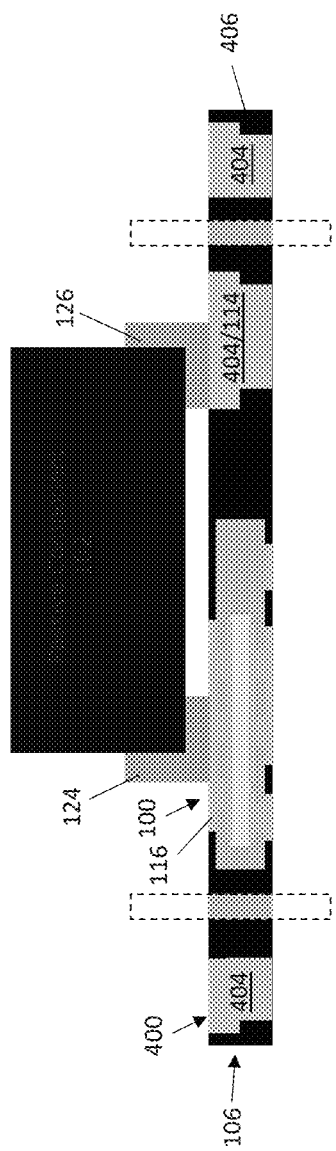

POWER STAGE DEVICE WITH CARRIER FRAME FOR POWER STAGE MODULE AND INTEGRATED INDUCTOR

BACKGROUND

In higher current converters such as point-of-use (POU) converters, point-of-load (POL) converters and other types of ac-to-dc and dc-to-dc converters, the size of the output inductor is typically much larger than the actual power stage module of the converter, the power stage module including the power stage of the power converter. For example, the inductor footprint may be 1.5×, 2× or even larger than the area of the power stage module. The size of the power stage module is typically increased to that of the integrated inductor, to integrate the inductor. However, the module substrate used to embed components of a POL or power stage provides most of the electrical connections for the power stage module and typically includes multiple layers, has small pitches, etc. and therefore is expensive. Increasing the module substrate size merely to accommodate a large inductor significantly adds to the overall cost of the device with no added benefit other than to integrate the inductor and power stage module in the same device.

Hence, there is a need for a more cost-effective solution for integrating an inductor with the power stage module of a power converter.

SUMMARY

According to an embodiment of a power device, the power device comprises: a frame comprising an electrically insulative material, an opening in the electrically insulative material, and an electrical conductor extending through the electrically insulative material; a power stage module fixed in the opening in the electrically insulative material and comprising an output terminal at a first side of the power stage module, and a power terminal, a ground terminal and a plurality of input/output (I/O) terminals at a second side of the power stage module opposite the first side; and a passive component comprising a first terminal attached to the output terminal of the power stage module and a second terminal attached to the electrical conductor of the frame, wherein the passive component has a larger footprint than the power stage module, wherein the frame expands the footprint of the power stage module to accommodate mounting of the passive component to the power device, wherein the frame has a lower interconnect density than the power stage module.

The only electrical connection provided by the frame may be a vertical electrical connection for the second terminal of the passive component from a top surface of the frame to a bottom surface of the frame.

Separately or in combination, the frame may be a first printed circuit board (PCB), the electrical conductor of the frame may comprise one or more plated through holes extending from a top surface of the first PCB to a bottom surface of the first PCB, and the first PCB may be devoid of metal traces running in a direction perpendicular to the top and the bottom surfaces of the first PCB.

Separately or in combination, the power stage module may comprise a second PCB and at least one semiconductor die embedded in the second PCB between top and bottom surfaces of the second PCB, the second PCB may comprise at least two layers with micro-via connections and metal traces which provide electrical connection to the at least one semiconductor die embedded within the second PCB, and at least some of the metal traces of the second PCB may run in a direction perpendicular to the top and the bottom surfaces of the second PCB.

Separately or in combination, the second PCB may have a line/space (L/S) ratio of 75 μm/75 μm or less and the first PCB may have a L/S ratio of 150 μm/150 μm or greater.

Separately or in combination, the second PCB may be fixed in the opening in the first PCB by glue, mechanical fixing or solder.

Separately or in combination, the frame may be a molded leadframe comprising a plurality of leads embedded in a mold compound and the electrical conductor of the frame may comprise one or more leads of the plurality of leads which are not covered by the mold compound at both a top surface of the molded leadframe and a bottom surface of the molded leadframe.

Separately or in combination, the power stage module may be embedded in the mold compound of the molded leadframe, the output terminal at the first side of the power stage module may not be covered by the mold compound, and the power terminal, the ground terminal and the plurality of I/O terminals at the second side of the power stage module may not be covered by the mold compound.

Separately or in combination, the electrically insulative material of the frame may be mold compound, the electrical conductor of the frame may be a metal block embedded in the mold compound, and the metal block may not be covered by the mold compound at both a top surface of the frame and a bottom surface of the frame.

Separately or in combination, the power stage module may be embedded in the mold compound, the output terminal at the first side of the power stage module may not be covered by the mold compound, and the power terminal, the ground terminal and the plurality of I/O terminals at the second side of the power stage module may not be covered by the mold compound.

Separately or in combination, the metal block may be a copper block comprising copper or a copper alloy.

Separately or in combination, the power stage module may comprise a first power transistor die, a second power transistor die and a driver die embedded in a PCB and configured as a half bridge having a switched node output electrically connected to the output terminal of the power stage module, and the passive component may be an inductor that electrically connects the switched node output to the electrical conductor of the frame.

According to an embodiment of a power system, the power system comprises: a PCB; and a power device attached to the PCB. The power device comprises: a frame comprising an electrically insulative material, an opening in the electrically insulative material, and an electrical conductor extending through the electrically insulative material and attached to one or more metal pads at a first side of the PCB; a power stage module fixed in the opening in the electrically insulative material and comprising an output terminal at a side of the power stage module facing away from the PCB, and a power terminal, a ground terminal and a plurality of input/output (I/O) terminals at a side of the power stage module facing the PCB and attached to respective additional metal pads at the first side of the PCB; and a passive component attached to the power device at a side of the power device facing away from the PCB, the passive component comprising a first terminal attached to the output terminal of the power stage module and a second terminal attached to the electrical conductor of the frame so that the output terminal of the power stage module is electrically connected to the one or more metal pads at the first side of the PCB by the passive component and the electrical conductor of the frame, wherein the passive component has a larger footprint than the power stage module, wherein the frame expands the footprint of the power stage module to accommodate mounting of the passive component to the power device, wherein the frame has a lower interconnect density than the power stage module.

According to an embodiment of a method of manufacturing a power device, the method comprises: forming a frame comprising an electrically insulative material, an opening in the electrically insulative material, and an electrical conductor extending through the electrically insulative material; fixing a power stage module in the opening in the electrically insulative material, the power stage module comprising an output terminal at a first side of the power stage module, and a power terminal, a ground terminal and a plurality of input/output (I/O) terminals at a second side of the power stage module opposite the first side; and attaching a first terminal of a passive component to the output terminal of the power stage module and a second terminal of the passive component to the electrical conductor of the frame, wherein the passive component has a larger footprint than the power stage module, wherein the frame expands the footprint of the power stage module to accommodate mounting of the passive component to the power device, wherein the frame has a lower interconnect density than the power stage module.

Separately or in combination, forming the frame may comprise: forming a first printed circuit board (PCB) having one or more plated through holes extending from a top surface of the first PCB to a bottom surface of the first PCB, the one or more plated through holes forming the electrical conductor of the frame, wherein the first PCB is devoid of metal traces running in a direction perpendicular to the top and the bottom surfaces of the first PCB.

Separately or in combination, fixing the power stage module in the opening in the electrically insulative material may comprise: mounting the first PCB on a carrier; mounting the power stage module on the carrier through the opening in the first PCB; gluing, mechanically fixing or soldering the power stage module to the first PCB while the power stage module and the first PCB are mounted on the carrier; and after gluing, mechanically fixing or soldering the power stage module to the first PCB, removing the carrier from the power device.

Separately or in combination, forming the frame and fixing the power stage module in the opening in the electrically insulative material may comprise: mounting a leadframe on a carrier, the leadframe having one or more leads which form the electrical conductor of the frame; mounting the power stage module on the carrier and laterally spaced apart from the one or more leads of the leadframe; embedding the one or more leads of the leadframe and the power stage module in a mold compound to form a molded package, wherein the one or more leads of leadframe and the terminals of the power stage module are not covered by the mold compound at both a top surface and a bottom surface of the molded package; and after forming the molded package, removing the carrier from the molded package.

Separately or in combination, forming the frame and fixing the power stage module in the opening in the electrically insulative material may comprise: mounting a metal block on a carrier, the metal block forming the electrical conductor of the frame; mounting the power stage module on the carrier and laterally spaced apart from the metal block; embedding the metal block and the power stage module in a mold compound to form a molded package, wherein the metal block and the terminals of the power stage module are not covered by the mold compound at both a top surface and a bottom surface of the molded package; and after forming the molded package, removing the carrier from the molded package.

Separately or in combination, wherein the metal block may be a copper block comprising copper or a copper alloy.

Separately or in combination, fixing the power stage module in the opening in the electrically insulative material may comprise: embedding a first power transistor die, a second power transistor die and a driver die embedded in a PCB and configured as a half bridge having a switched node output electrically connected to the output terminal of the power stage module; and fixing the PCB in the opening in the electrically insulative material, wherein the passive component is an inductor that electrically connects the switched node output to the electrical conductor of the frame.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1A illustrates a cross-sectional view of an embodiment of a power device that includes a power stage module of a power converter integrated with a passive component of the converter.

FIG. 1B illustrates a plan view of the top side of a frame of the power device to which the passive component is mounted.

FIG. 10 illustrates a plan view of the bottom side of the frame.

FIGS. 3A through 3E illustrate cross-sectional views during different stages of the manufacturing method, FIGS. 4A through 4E illustrate corresponding top plan views, and FIGS. 5A and 5B illustrate respective cross-sectional views after the passive component is attached to the power device.

FIGS. 6A through 6H illustrate respective cross-sectional views of another embodiment of a method of manufacturing the power device, during different stages of the manufacturing method.

DETAILED DESCRIPTION

Figure 2D:
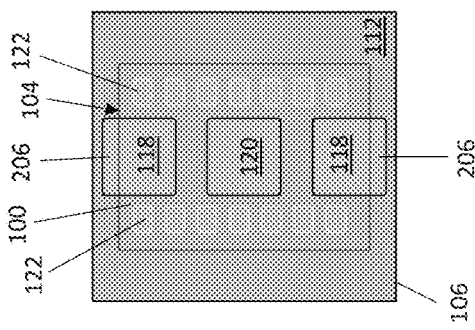
FIGS. 2A through 2D illustrate partial respective bottom plan views of different embodiments for fixing the power stage module in an opening of the frame.

Embodiments described herein provide a power device that includes a power stage module of a power converter integrated with one or more passive components of the converter. The power stage module is fixed in an opening of an electrically insulative frame. The frame expands the footprint of each power stage module to accommodate mounting of a corresponding passive component of the converter to the power device. The frame has a lower interconnect density than each power stage module accommodated by the frame. This way, a lower-cost electrically insulative material such as a lower-density printed circuit board (PCB), mold compound, etc. may be used for the frame whereas a denser (and expensive) PCB may be used for each power stage module. The resulting power device thus has a lower overall cost while still integrating one or more passive components of the power converter with the power stage module(s).

FIG. 1A illustrates a cross-sectional view of an embodiment of a power device that includes a power stage module 100 of a power converter integrated with a passive component 102 of the converter, the power stage module 100 being fixed in an opening 104 of an electrically insulative frame 106. FIG. 1B illustrates a plan view of the top side 108 of the frame 106, i.e., the side of the frame 106 to which the passive component 102 is mounted. FIG. 10 illustrates a plan view of the bottom side 110 of the frame 106, i.e., the side of the frame 106 facing away from the passive component 102. The cross-section in FIG. 1A is taken along the line labelled A-A' in FIGS. 1B and 10.

The type of power device depends on the type of power converter. For example, the power converter may be a switched-capacitor converter and the passive component 102 may include one or more capacitors of the switched-capacitor converter. In another example, the power converter may be an isolated or non-isolated converter and the passive component 102 may be an output inductor. The converter may be resonant or non-resonant. The power converter may include one power stage module 100 in the case of a single-phase converter or more than one power stage module 100 in the case of a multi-phase converter (e.g. one power stage module per phase), each phase configured to contribute to the overall load current. Still other combinations of power converter and passive component types may be integrated in accordance with the power device embodiments described herein.

In general, the frame 106 of the power device includes an electrically insulative material 112, an opening 104 in the electrically insulative material 112 and an electrical conductor 114 extending through the electrically insulative material 112. A power stage module 100 is fixed in the opening 104 in the electrically insulative material 112 of the frame 106. The power stage module 100 includes an output terminal 116 at the top side of the power stage module 100 (FIG. 10), and a power terminal 118, a ground terminal 120 and a plurality of input/output (I/O) terminals 122 at the bottom side of the power stage module 100 (see FIG. 1B). The passive component 102 is mounted to the top side of the power stage module 100. The passive component 102 may be a capacitor or an inductor, depending on the type of power device and power converter.

The passive component 102 has a first terminal 124 attached to the output terminal 116 of the power stage module 100 and a second terminal 126 attached to the electrical conductor 114 of the frame 106. The terminals 124, 126 of the passive component 102 may be directly attached or attached using a suitable material 128 such as solder, adhesive, etc. The electrical conductor 114 of the frame 106 provides an electrical connection between the top and bottom sides 108, 110 of the frame 106 for the second terminal 126 of the passive component 102. The passive component 102 has a larger footprint than the power stage module 100. The frame 106 expands the footprint of the power stage module 100 to accommodate mounting of the passive component 102 to the power device. The frame 106 has a lower interconnect density than the power stage module 100 and therefore is less expensive. This way, the footprint of the power stage module 100 is effectively increased in an inexpensive manner, e.g., compared to making the more expensive power stage module 100 larger merely to accommodate mounting of the passive component 102. The passive component 102 is not shown in FIGS. 1B and 10 so that the features of the power stage module 100 and the frame 106 are unobstructed in these figures.

Any lower-density electrically insulative material 112 may be used for the frame 106, since the primary electrical connection provided by the frame 106 is between the top and bottom sides 108, 110 of the frame 106 for the second terminal 126 of the passive component 102. In one embodiment, the only electrical connection provided by the frame 106 is the electrical conductor 114 of the frame 106 which provides an electrical connection between the top and bottom sides 108, 110 of the frame 106 for the second terminal 126 of the passive component 102. Hence, a higher-density electrically insulative material with many layers and μvia (micro-via) connections is not necessary for the frame 106. In one embodiment, the electrically insulative material 112 of the frame 106 is an insulating substrate of a lower-density PCB, e.g., FR-4 glass epoxy, a modified epoxy, polyimide, etc. In another embodiment, the electrically insulative material 112 of the frame 106 is a mold compound. Mold compounds are generally composite materials which include, e.g., epoxy resins, phenolic hardeners, silicas, catalysts, pigments, mold release agents, etc. Still other types of lower-density electrically insulative materials 112 may be used for the frame 106.

In the case of a lower-density PCB as the frame 106, the electrical conductor 114 which provides an electrical connection between the top and bottom sides 108, 110 of the frame 106 for the second terminal 126 of the passive component 102 may be a single (large) plated through hole or a plurality of (smaller) plated through holes. In the case of a mold compound as the frame 106, the electrical conductor 114 may be a metal (e.g. Cu) block or one or more leads of a leadframe. Still other types of electrical conductors 114 may be used, depending on the type of lower-density electrically insulative material 112 used for the frame 106.

In one embodiment, the power stage module 100 fixed in the opening 104 of the frame 106 includes a higher-density PCB having multiple layers, small pitches, etc. and in which the semiconductor component(s) of the power stage are embedded. The power stage forms a phase of the power converter, which may be single-phase or multi-phase as explained above. Semiconductor components of the power stage may include one or more power transistors such as such as, but not limited to, power MOSFETs (metal oxide semiconductor field effect transistors), IGBTs (insulated gate bipolar transistors), HEMTs (high electron mobility transistors), etc.

The power stage module 100 may include a single power transistor, e.g., a synchronous rectifier switch, or multiple power transistors, e.g., in the case of a half bridge or full bridge rectifier. Further semiconductor components of the power stage module 100 may include a driver for driving the gates of the power transistor(s), a controller for controlling operation of the power stage, etc. The controller and/or driver may be included in the power stage module 100, or may be provided in a separate module(s). Again, as explained above, the number and type of devices that makeup the power stage depends on the type of converter. The semiconductor components included in the power stage module 100 may be integrated in the same semiconductor die (chip) or may be provided in separate dies.

In general, each semiconductor die 130 included in the power stage module 100 is embedded in a higher-density PCB or similar chip embedding structure 132. The term "higher-density" as used herein means that the chip embedding structure 132 of the power stage module 100 is sufficiently compact so as to provide the necessary electrical connections for each semiconductor die 130 embedded in the chip embedding structure 132 in as little area as possible or technically feasible, so that the power stage module 100 does not have an excessively or unnecessarily large footprint. For example, the chip embedding structure 132 may be an HDI (high-density interconnection) PCB which is a PCB having higher wiring density per unit (e.g. a line/space of typically 35-150 μm), the vertical connections within the PCB are typically plated laser drilled μvias (e.g. the through-connections between the layers may be implemented with stacked μvias or small size 75-150 μm plated through holes), the capture lands for the vias and plated through holes are much smaller than in conventional PCBs, the PCB material is typically medium or high Tg (glass transition temperature) FR4 or BT resin material or a low CTE FR4 material, the PCB material is much cleaner compared to conventional PCB material (e.g. very low halogen content—more expensive and cleaner raw materials are needed). In the case of an HDI PCB as the chip embedding structure 132, higher cost materials and more expensive PCB processes are used for manufacturing the chip embedding structure 132.

For example, in the case of a higher-density PCB as the chip embedding structure 132 of the power stage module 100, the chip embedding structure 132 may have 2, 3, 4 or more layers of electrically insulative materials in which each semiconductor die 130 of the power stage is embedded, with μvia connections between each semiconductor die 130 and the chip embedding structure 132 and small-size plated through vias between the top and bottom sides of the chip embedding structure 132. For example, the size of the μvia connections may range between 50 to 150 μm, the size of the plated through vias may range between 100 μm to 200 μm, and copper may fill the plated through vias and μvias. Pattern dimensions (L/S) of the chip embedding structure 132 may be 75 μm/75 μm or less in the case of a higher-density PCB. Such a higher-density PCB or similar chip embedding structure may be constructed from FR-4 (or similar) material, high purity material (e.g. Chlorine content typically <20 PPM), and may have a very high cost (e.g. typically 20 to 50 or even 100 times more expensive than conventional low cost 2-layer PCBs). Still other types of chip embedding structures 132 may be used for the power stage module 100. In general, the chip embedding structure 132 of the power stage module 100 has a higher interconnect density than the frame 106.

Regardless of the type of chip embedding structure 132 used for the power stage module 100 and the number of semiconductor dies 132 embedded in the chip embedding structure 132, the power stage module 100 is fixed in the opening 104 in the electrically insulative material 112 of the frame 106. The output terminal 116 at the top side of the power stage module 100 is attached to the first terminal 124 of the passive component 102. The power, ground and I/O terminals 118, 120, 122 at the bottom side of the power stage module 100 are accessible for attachment to another structure 134 such as another power stage module, a circuit board, etc. to form a power system such as such as a POU converter, POL converter or any other type of ac-to-dc or dc-to-dc converter. The electrical conductor 114 which extends through the electrically insulative material 112 of the frame 106 provides a point of electrical connection for the second terminal 126 of the passive component 102 at the same side of the power device as the power, ground and I/O terminals 118, 120, 122 of the power stage module 100.

FIGS. 2A through 2D illustrate bottom plan views of respective embodiments for fixing the power stage module 100 in the opening 104 of the frame 106. Only part of the frame 106 is shown in FIGS. 2A through 2D.

Figure 2C:
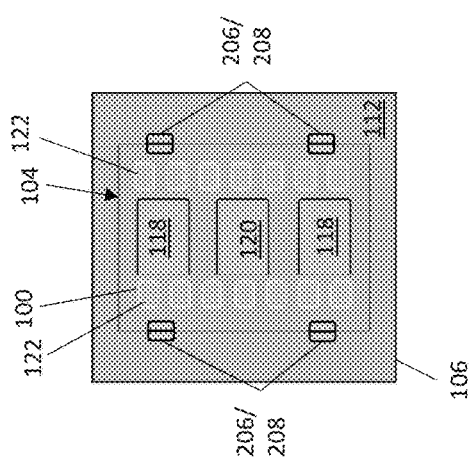
Figure 2B:
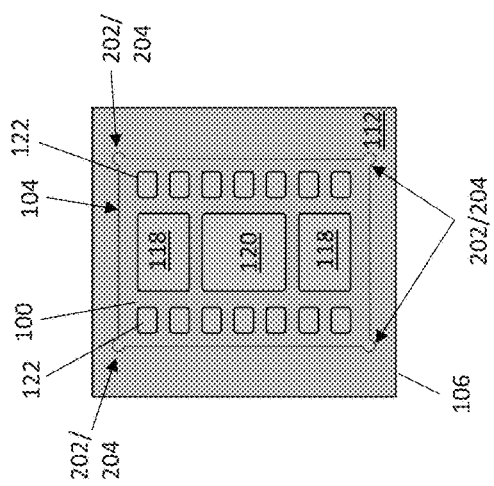
Figure 2A:
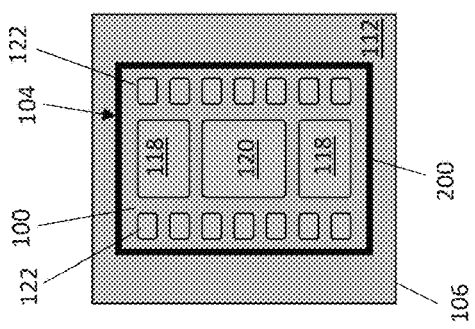

In FIG. 2A, the power stage module 100 is fixed by glue 200 in the opening 104 in the electrically insulative material 112 of the frame 106. The power stage module 100 is shown fixed to the frame 106 along all four sides of the opening 104 in FIG. 2A. In general, the power stage module 100 may be fixed to the frame 106 along one, two, three or all four sides of the opening 104. In FIG. 2B, the power stage module 100 is mechanically fixed in the opening 104 in the electrically insulative material 112 of the frame 106. For example, the opening 104 in the electrically insulative material 112 of the frame 106 may have one or more surface features 202 which mate with a corresponding surface feature 204 on the edge face of the power module 100 to mechanically fix the power module 100 in place. In FIGS. 2C and 2D, the power stage module 100 is fixed by solder in the opening 104 in the electrically insulative material 112 of the frame 106. According to these embodiments, the frame 106 includes at least one metal structure 206 which is laterally aligned with a corresponding metal structure 208 of the power stage module 100 to form at least one solderable joint between the frame 106 and the power stage module 100. In FIG. 2C, the frame 106 includes a plurality of metal structures 206 which are each laterally aligned with a corresponding metal structure 208 of the power stage module 100 separate from the terminals 118, 120, 122 at the bottom side of the module 100 to form the solderable joints. In FIG. 2D, some of the terminals 118 at the bottom side of the power stage module 100 form part of the solderable joints.

Described next are various embodiments of methods of manufacturing the power device described herein.

Figure 4A:
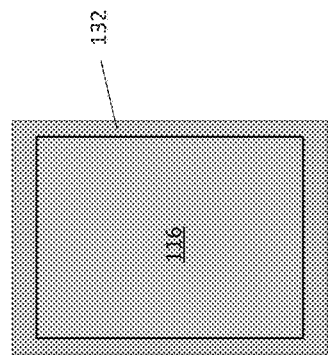
FIGS. 3A through 3E, 4A through 4E, 5A and 5B illustrate an embodiment of a method of manufacturing the power device.
Figure 4B:
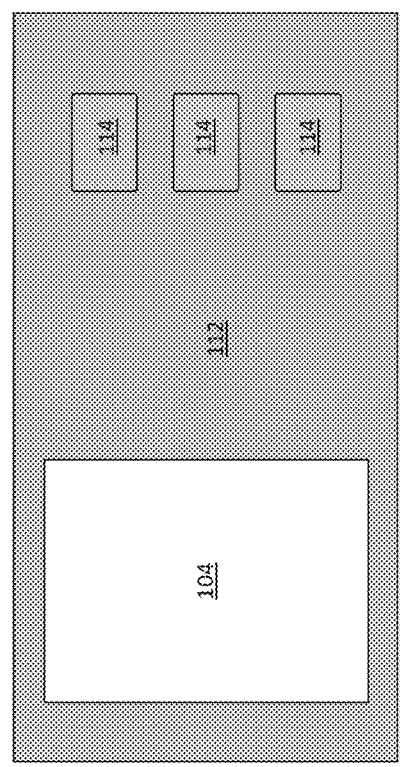
Figure 3A:
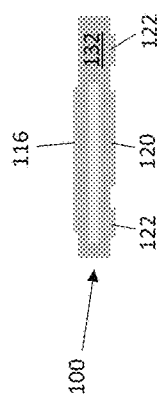
Figure 3B:
Figure 4C:
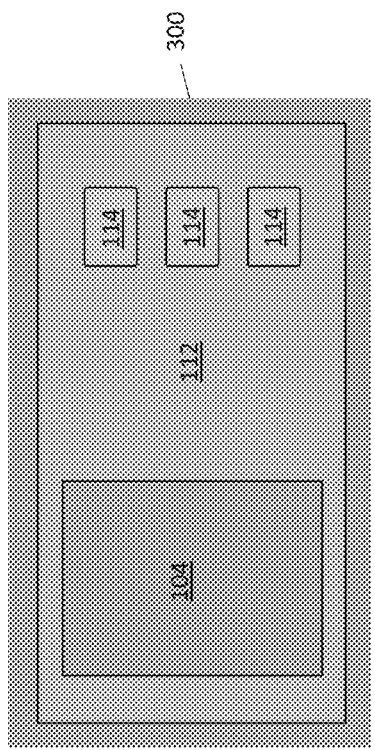
Figure 4D:
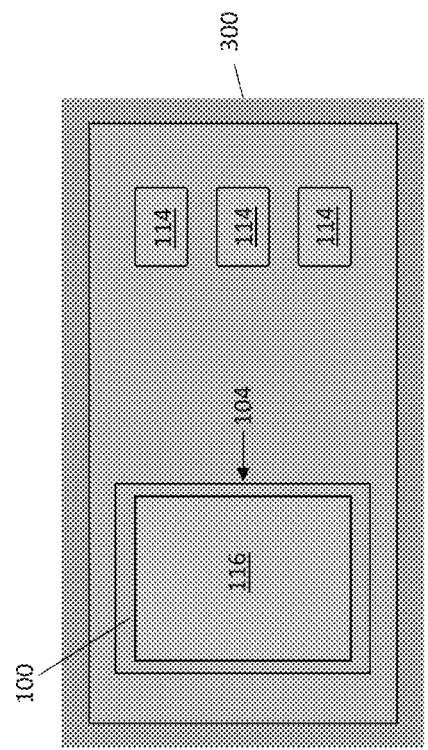
Figure 3C:
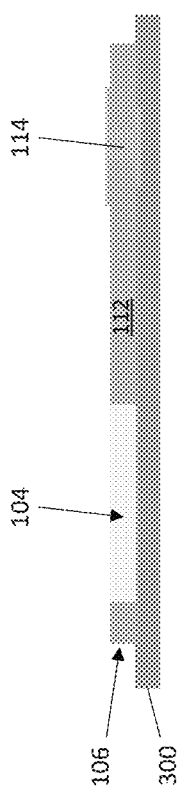
Figure 3D:
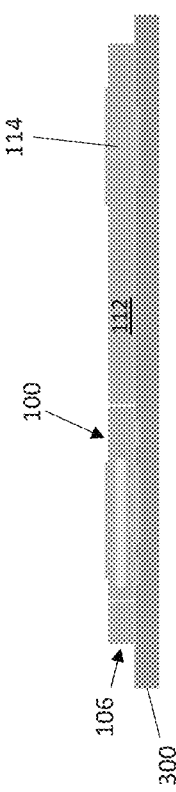
Figure 4E:
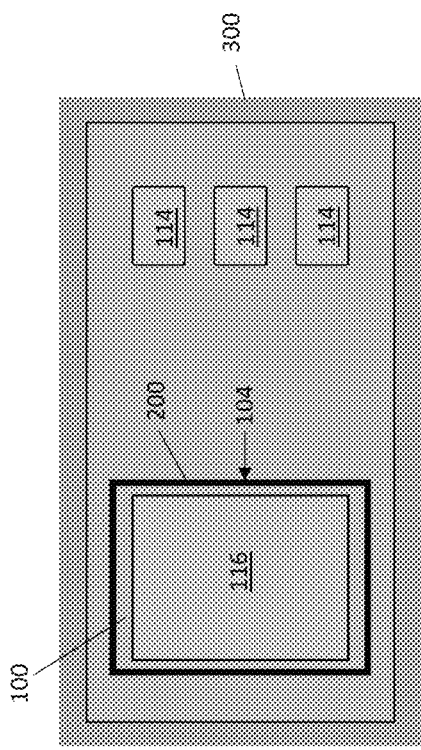
Figure 5A:
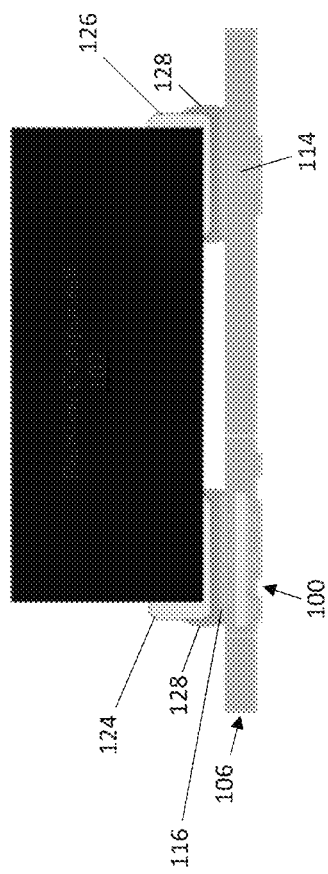
Figure 5B:
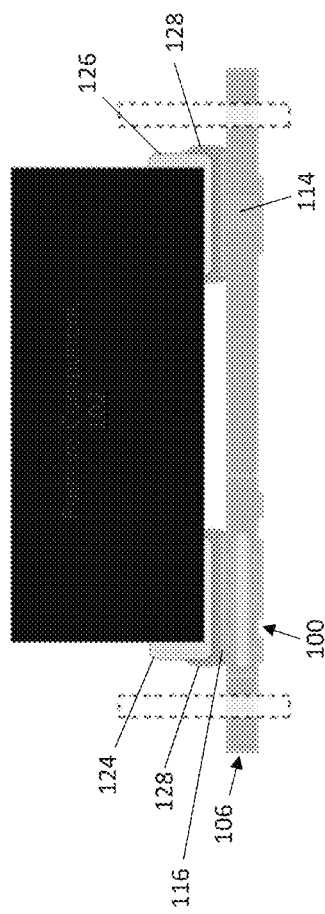

FIGS. 3A through 5B illustrate one embodiment of a method of manufacturing the power device described herein. FIGS. 3A through 3E illustrate cross-sectional views during different stages of the manufacturing method, FIGS. 4A through 4E illustrate corresponding top plan views, and FIGS. 5A and 5B illustrate respective cross-sectional views after the passive component 102 is attached to the power device.

FIGS. 3A and 4A show the power stage module 100 and FIGS. 3B and 4B show the frame 106, prior to fixing the power stage module 100 in the opening 104 of the frame 106. The frame 106 includes an electrically insulative material 112, an opening 104 in the electrically insulative material 112 and an electrical conductor 114 extending through the electrically insulative material 112, as previously explained herein. The power stage module 100 includes an output terminal 116 at the top side of the power stage module 100, and power, ground and I/O terminals 118, 120, 122 at the bottom side of the power stage module 100, also as previously described herein. The frame 106 expands the footprint of the power stage module 100 to accommodate mounting of a passive component 102 to the power device, and the frame 106 has a lower interconnect density than the power stage module 100.

According to the embodiment illustrated in FIGS. 3A through 4E, the frame 106 is implemented as a lower-density PCB, the electrical conductor 112 of the frame 106 is one or more plated through holes extending from a top surface of the lower-density PCB to a bottom surface of the lower-density PCB, and the lower-density PCB is devoid of metal traces running in a direction perpendicular to the top and the bottom surfaces of the lower-density PCB. For example, the plated through hole size may be in a range of 200 to 500 μm or greater, or if Cu-filled vias are used, in a range of 150 to 200 μm. Further according to this embodiment, the power stage module 100 is implemented as a higher-density PCB with at least one semiconductor die 130 embedded in the higher-density PCB between top and bottom surfaces of the higher-density PCB. The higher-density PCB has at least two layers with micro-via connections and metal traces which provide electrical connections to the at least one semiconductor die 130 embedded within the higher-density PCB. At least some of the metal traces of the higher-density PCB run in a direction perpendicular to the top and the bottom surfaces of the higher-density PCB.

FIGS. 3C and 4C show the lower-density PCB of the frame 106 mounted on a carrier 300 such as a carrier tape. The opening 104 in the frame 106 extends completely through the lower-density PCB so that part of the carrier 300 remains exposed by the opening 104.

FIGS. 3D and 4D show the power stage module 100 mounted on the exposed part of the carrier 300, through the opening 104 in the frame 106.

Figure 3E:
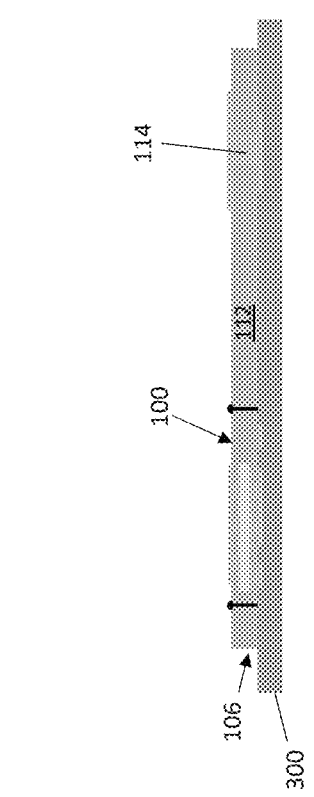

FIGS. 3E and 4E show the power stage module 100 fixed to the frame 106 while the power stage module 100 and the frame 106 are mounted on the carrier 300, e.g., by gluing, mechanically fixing or soldering the power stage module 100 to the frame 106 as previously described herein in connection with FIGS. 2A-2D. The carrier 300 may be removed from the power device after the power stage module 100 is fixed to the frame 106.

FIG. 5A shows the power device after the carrier 300 is removed, and after the first terminal 124 of the passive component 102 is attached to the output terminal 116 of the power stage module 100 and the second terminal 126 of the passive component 102 is attached to the electrical conductor 114 of the frame 106. The passive component 102 has a larger footprint than the power stage module 100, and the frame 106 expands the footprint of the power stage module 100 to accommodate mounting of the passive component 102 to the power device.

FIG. 5B shows the power device during a singulation process which separates the power device from other power devices fabricated at the same time. Any typical singulation process such as sawing may be used to singulate individual power devices. The singulation process is illustrated by dashed boxes in FIG. 5B.

FIGS. 6A through 6H illustrate respective cross-sectional views of another embodiment of a method of manufacturing the power device described herein, during different stages of the manufacturing method.

Figure 6A:

FIG. 6A shows the power stage module 100. According to the embodiment illustrated in FIGS. 6A through 6H, the power stage module 100 is implanted as a higher-density PCB with at least one semiconductor die 130 embedded in the higher-density PCB between top and bottom surfaces of the higher-density PCB. The higher-density PCB has at least two layers with micro-via connections and metal traces which provide electrical connections to the at least one semiconductor die 130 embedded within the higher-density PCB. At least some of the metal traces of the higher-density PCB run in a direction perpendicular to the top and the bottom surfaces of the higher-density PCB.

Figure 6B:
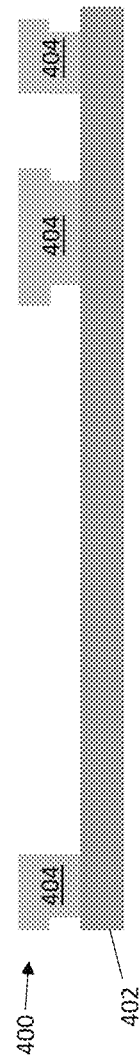

FIG. 6B shows a leadframe 400 mounted on a carrier 402 such as a carrier tape. The leadframe 400 has one or more leads 404 which form the electrical conductor 114 of the frame 106. The leadframe 400 does not have a die paddle in this embodiment.

Figure 6C:
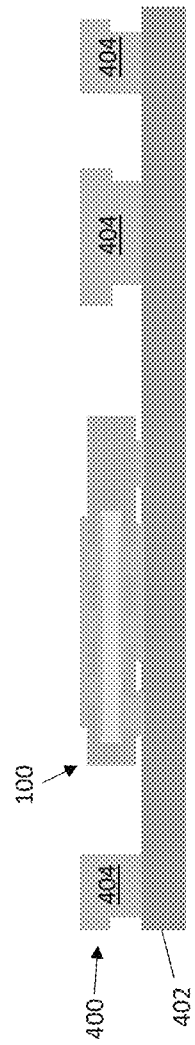

FIG. 6C shows the power stage module 100 mounted on the carrier 402 and laterally spaced apart from the lead(s) 404 of the leadframe 400.

Figure 6D:
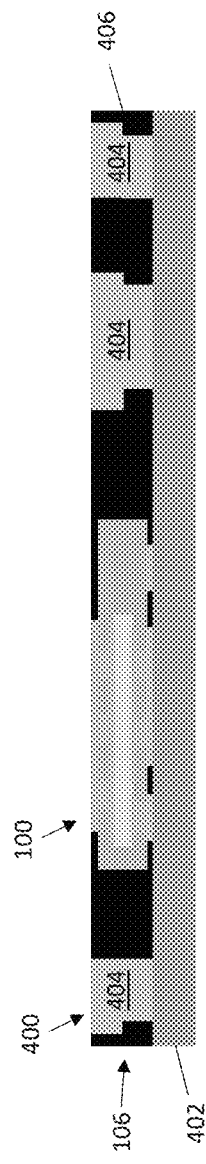

FIG. 6D shows the lead(s) 404 of the leadframe 400 and the power stage module 100 embedded in a mold compound 408 to form a molded package. Any molding process typically used to form molded semiconductor packages may be used such as injection molding, film-assist molding, transfer molding, etc. The lead(s) 404 of the leadframe 400 and the terminals 116, 118, 120, 122 of the power stage module 100 are not covered by the mold compound 406 at both the top and bottom surfaces of the molded package.

FIG. 6E shows the molded package after removing the carrier 402.

FIG. 6F shows the molded package after the first terminal 124 of the passive component 102 is attached to the output terminal 116 of the power stage module 100 and the second terminal 124 of the passive component 102 is attached to a lead 404 of the leadframe 400 which forms the electrical conductor 114 of the frame 106. The passive component 102 has a larger footprint than the power stage module 100. The frame 106, which includes the mold compound 406 and the leadframe 400 in this embodiment, expands the footprint of the power stage module 100 to accommodate mounting of the passive component 102 to the power device.

FIG. 6G shows the molded package during a singulation process which separates the molded package from other molded packages fabricated at the same time. Any typical singulation process such as sawing may be used to singulate individual molded packages. The singulation process is illustrated by dashed boxes in FIG. 6G.

Figure 6H:
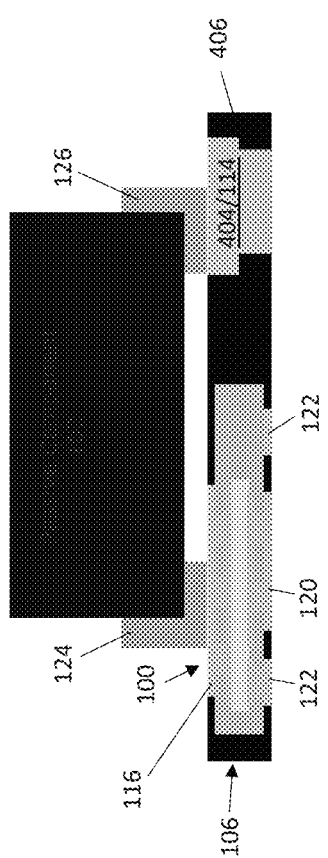

FIG. 6H shows one of the singulated molded packages. According to this embodiment, the frame 106 of the power device is a molded leadframe comprising one or more leads 404 embedded in a mold compound 406, and the electrical conductor 114 of the frame 106 is one or more of the leads 404 which are not covered by the mold compound 406 at both top and bottom surfaces of the molded leadframe. Further according to this embodiment, the power stage module 100 is embedded in the mold compound 406 of the molded leadframe so that the output terminal 116 at the top side of the power stage module 100 is not covered by the mold compound 406, and the power, ground and I/O terminals 118, 120, 122 at the bottom side of the power stage module 100 are also not covered by the mold compound 406. The power stage module 100 is fixed in place by the mold compound 406 according to this embodiment. The power stage module 100 and/or the mold compound 406 may have surface features such as bumps, protrusions, dimples, etc. which enhance the fixing.

The mold compound-based frame 106 in FIG. 6H is less expensive than the lower-density PCB-based frame 106 in FIG. 5B. Also, use of leadframe lead(s) 404 as the electrical conductor 112 of the frame 106 provides lower resistance and better thermal dissipation compared to the plated through holes of the lower-density PCB-based frame 106 shown in FIG. 5B. Also, leadframe strips are compatible with typical package assembly processes such as molding, plating, surface mounting of passive components and singulation.

FIGS. 7A through 7G illustrate respective cross-sectional views of another embodiment of a method of manufacturing the power device described herein, during different stages of the manufacturing method.

Figure 7A:
FIGS. 7A through 7G illustrate respective cross-sectional views of yet another embodiment of a method of manufacturing the power device, during different stages of the manufacturing method.

FIG. 7A shows the power stage module 100 and a separate metal block 500. The metal block 500 forms the electrical conductor 114 of the frame 106 of the power device. In one embodiment, the metal block 500 is a copper block comprising copper or a copper alloy. According to the embodiment illustrated in FIGS. 7A through 7G, the power stage module 100 includes a PCB with at least one semiconductor die 130 embedded in the PCB between top and bottom surfaces of the PCB. The PCB has at least two layers with micro-via connections and metal traces which provide electrical connections to the at least one semiconductor die 130 embedded within the PCB. At least some of the metal traces of the PCB run in a direction perpendicular to the top and the bottom surfaces of the PCB.

Figure 7B:
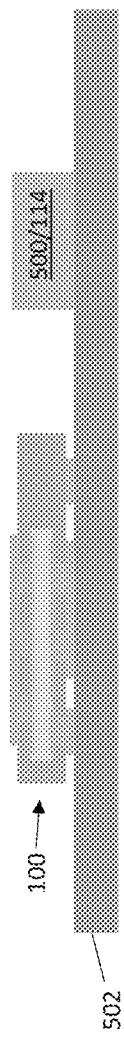

FIG. 7B shows the power stage module 100 and the metal block 500 mounted on a carrier 502 such as a carrier tape. The power stage module 100 is laterally spaced apart from the metal block 500 when mounted on the carrier 502.

Figure 7C:
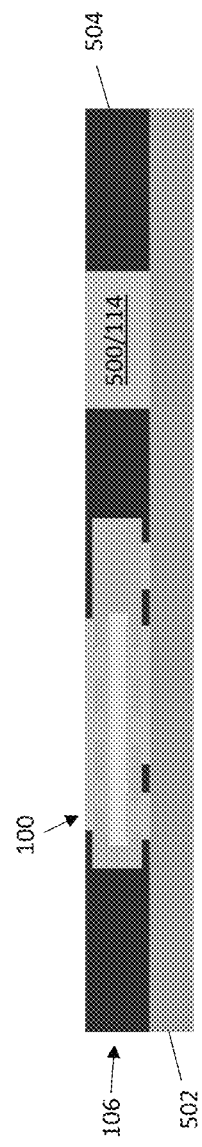

FIG. 7C shows the metal block 500 and the power stage module 100 embedded in a mold compound 504 to form a molded package. Any molding process typically used to form molded semiconductor packages may be used such as injection molding, film-assist molding, transfer molding, etc. The metal block 500 and the terminals 116, 118, 120, 122 of the power stage module 100 are not covered by the mold compound 504 at both the top and bottom surfaces of the molded package.

Figure 7D:
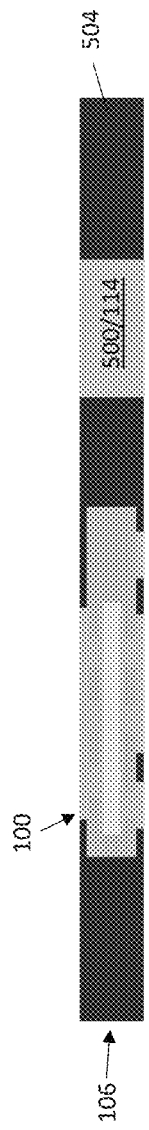

FIG. 7D shows the molded package after removing the carrier 502.

Figure 7E:
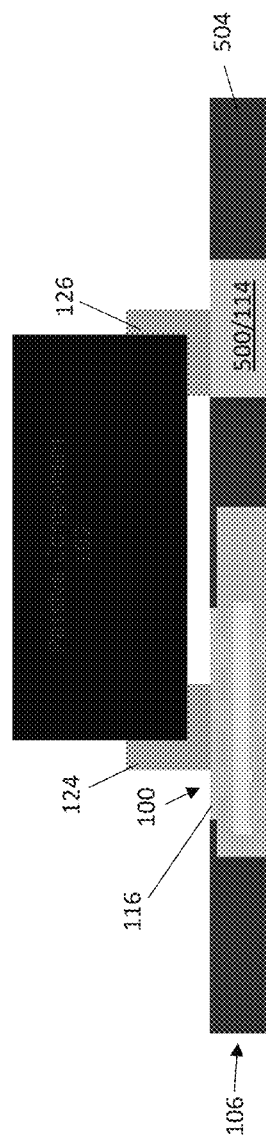

FIG. 7E shows the molded package after the first terminal 124 of the passive component 102 is attached to the output terminal 116 of the power stage module 100 and the second terminal 126 of the passive component 102 is attached to the metal block 500 which forms the electrical conductor 114 of the frame 106. The passive component 102 has a larger footprint than the power stage module 100. The frame 106, which includes the mold compound 504 and the metal block 500 in this embodiment, expands the footprint of the power stage module 100 to accommodate mounting of the passive component 102 to the power device.

Figure 7F:
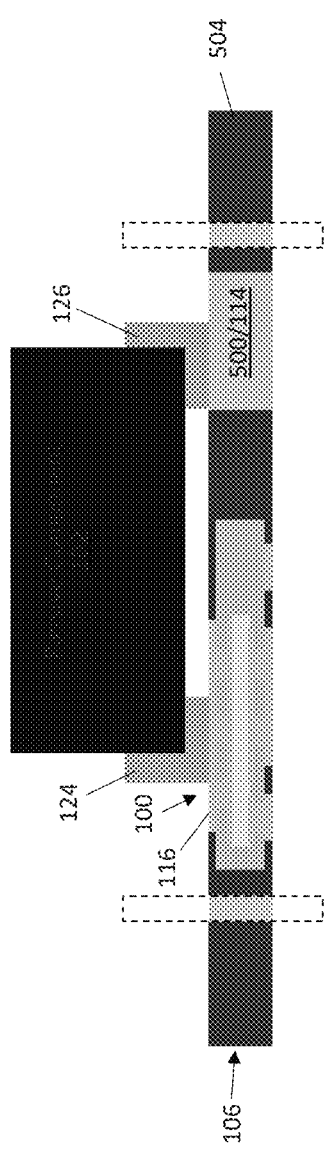

FIG. 7F shows the molded package during a singulation process which separates the molded package from other molded packages fabricated at the same time. Any typical singulation process such as sawing may be used to singulate individual molded packages. The singulation process is illustrated by dashed boxes in FIG. 7F.

Figure 7G:
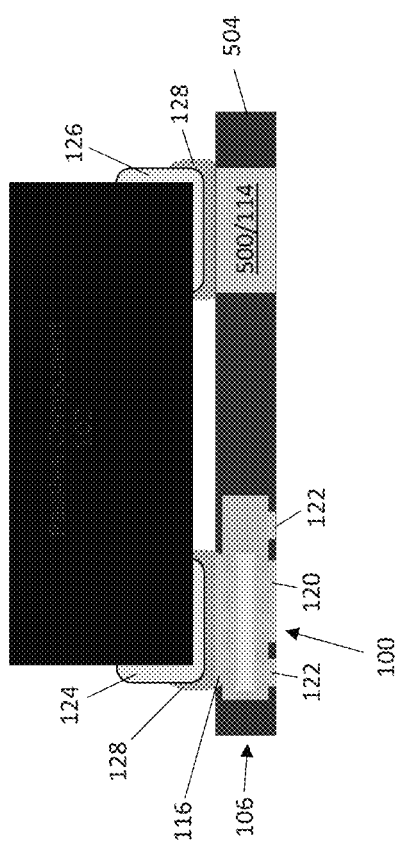

FIG. 7G shows one of the singulated molded packages. According to this embodiment, the electrically insulative material 114 of the frame 106 is a mold compound 504, the electrical conductor 112 of the frame 106 is a metal block 500 embedded in the mold compound 504, and the metal block 500 is not covered by the mold compound 504 at both top and bottom surfaces of the frame 106. The power stage module 100 is embedded in the mold compound 504 so that the output terminal 116 at the top side of the power stage module 100 is not covered by the mold compound 504, and the power, ground and I/O terminals 118, 120, 122 at the bottom side of the power stage module 100 are also not covered by the mold compound 504. The power stage module 110 is fixed in place by the mold compound 504. The power stage module 100 and/or the mold compound 504 may have surface features such as bumps, protrusions, dimples, etc. which enhance the fixing.

As previously explained herein, the type of power device depends on the type of power converter. For example, the power converter may be a switched-capacitor converter and one or more capacitors of the switched-capacitor converter may be integrated with the power stage module of the converter in accordance with the power device embodiments described herein. In another example, the power converter may be an isolated or non-isolated converter and the passive component integrated with the power stage module may be an output inductor. The converter may be resonant or non-resonant. The power converter may include one power stage module in the case of a single-phase converter or more than one power stage module in the case of a multi-phase converter (e.g. one power stage module per phase), each phase configured to contribute to the overall load current. Still other combinations of power stage module and passive component types may be integrated in accordance with the power device embodiments described herein.

Figure 8:
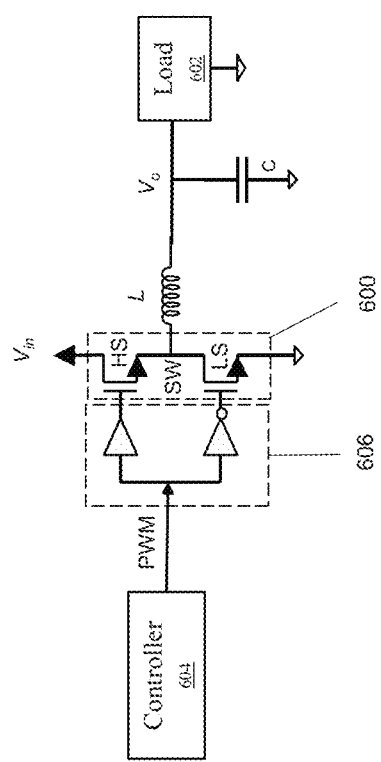
FIG. 8 illustrates an exemplary schematic diagram of a half bridge type power stage which may be implemented by the power stage module of the power device.

FIG. 8 illustrates an exemplary schematic diagram of a half bridge type power stage 600. Such a half bridge power device may be used in various types of converters including, but not limited to, switched mode power supplies such as boost converters, buck converters, buck-boost converters, flyback converters, resonant converters, etc. The power stage 600 provides one phase of the converter. The converter may be a single-phase or multi-phase converter.

The half bridge power stage 600 includes a high-side switch device HS coupled between an input voltage Vin and a common switch node SW, and a low-side switch device LS coupled between the common switch node SW and a reference potential such as ground. The switch node SW is coupled to a load 602 through an output capacitor C and an output inductor L. A controller 604 adjusts the duty cycle of the control signal PWM for the high-side switch device HS and the low-side switch device LS, so as to regulate the output voltage $V_O$ provided to the load $R_L$. A driver 606 converters the control signal PMW to an appropriate voltage signal suitable for the gates of the high-side and low-side switch devices HS, LS. The high-side switch device HS and the low-side switch device LS may be implemented using any standard type of power transistor switch typically used in power stages of a power converter, such as but not limited to power MOSFETs (metal oxide semiconductor field effect transistors), IGBTs (insulated gate bipolar transistors), HEMTs (high electron mobility transistors), etc.

The high-side switch device HS, low-side switch device LS and driver 606 may be realized in separate semiconductor dies or integrated in the same semiconductor die. In the case of separate dies, the power stage module 100 described herein includes a first power transistor die which includes the high-side switch device HS, a second power transistor die which includes the low-side switch device LS and a driver die which includes the driver 606. Each of the dies is embedded in an electrically insulative material such as a higher-density PCB. The high-side switch device HS, low-side switch device LS and driver 606 may instead be integrated in the same semiconductor die.

In either case, electrical connections are formed between the switch device HS, low-side switch device LS and driver 606 so that the power stage 600 is configured as a half bridge as shown in FIG. 8. These electrical connections are formed by the power stage module 100. For example, the switched node SW output of the half bridge 600 is electrically connected to the output terminal 116 of the power stage module 100. The input voltage Vin of the half bridge 600 is electrically connected to the power terminal 118 of the power stage module 100. The reference terminal of the half bridge 600 is connected to the ground terminal 120 of the power stage module 100. The input to the driver 606 is electrically connected to one of the I/O terminals 122 of the power stage module 100. The output inductor L electrically connects the output terminal 116 of the power stage module 100, which corresponds to the switched node SW output of the half bridge 600, to the electrical conductor 112 of the frame 106.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power device, comprising:
   a frame comprising an electrically insulative material, an opening in the electrically insulative material, and an electrical conductor extending through the electrically insulative material;
   a power stage module fixed in the opening in the electrically insulative material and comprising an output terminal at a first side of the power stage module, and a power terminal, a ground terminal and a plurality of input/output (I/O) terminals at a second side of the power stage module opposite the first side; and
   a passive component comprising a first terminal attached to the output terminal of the power stage module and a second terminal attached to the electrical conductor of the frame,
   wherein the passive component has a larger footprint than the power stage module,
   wherein the frame expands the footprint of the power stage module to accommodate mounting of the passive component to the power device,
   wherein the frame has a lower interconnect density than the power stage module.

2. The power device of claim 1, wherein the only electrical connection provided by the frame is a vertical electrical connection for the second terminal of the passive component from a top surface of the frame to a bottom surface of the frame.

3. The power device of claim 1, wherein the frame is a first printed circuit board (PCB), wherein the electrical conductor of the frame comprises one or more plated through holes extending from a top surface of the first PCB to a bottom surface of the first PCB, and wherein the first PCB is devoid of metal traces running in a direction perpendicular to the top and the bottom surfaces of the first PCB.

4. The power device of claim 3, wherein the power stage module comprises a second PCB and at least one semiconductor die embedded in the second PCB between top and bottom surfaces of the second PCB, wherein the second PCB comprises at least two layers with micro-via connections and metal traces which provide electrical connection to the at least one semiconductor die embedded within the second PCB, and wherein at least some of the metal traces of the second PCB run in a direction perpendicular to the top and the bottom surfaces of the second PCB.

5. The power device of claim 4, wherein the second PCB has a line/space (L/S) ratio of 75 µm/75 µm or less, and wherein the first PCB has a L/S ratio of 150 µm/150 µm or greater.

6. The power device of claim 4, wherein the second PCB is fixed in the opening in the first PCB by glue, mechanical fixing or solder.

7. The power device of claim 1, wherein the frame is a molded leadframe comprising a plurality of leads embedded in a mold compound, and wherein the electrical conductor of the frame comprises one or more leads of the plurality of leads which are not covered by the mold compound at both a top surface of the molded leadframe and a bottom surface of the molded leadframe.

8. The power device of claim 7, wherein the power stage module is embedded in the mold compound of the molded leadframe, wherein the output terminal at the first side of the power stage module is not covered by the mold compound, and wherein the power terminal, the ground terminal and the plurality of I/O terminals at the second side of the power stage module are not covered by the mold compound.

9. The power device of claim 1, wherein the electrically insulative material of the frame is mold compound, wherein the electrical conductor of the frame is a metal block embedded in the mold compound, and wherein the metal block is not covered by the mold compound at both a top surface of the frame and a bottom surface of the frame.

10. The power device of claim 9, wherein the power stage module is embedded in the mold compound, wherein the output terminal at the first side of the power stage module is not covered by the mold compound, and wherein the power terminal, the ground terminal and the plurality of I/O terminals at the second side of the power stage module are not covered by the mold compound.

11. The power device of claim 9, wherein the metal block is a copper block comprising copper or a copper alloy.

12. The power device of claim 1, wherein the power stage module comprises a first power transistor die, a second power transistor die and a driver die embedded in a PCB and configured as a half bridge having a switched node output electrically connected to the output terminal of the power stage module, and wherein the passive component is an inductor that electrically connects the switched node output to the electrical conductor of the frame.

13. A power system, comprising:
   a PCB; and
   a power device attached to the PCB, the power device comprising:
      a frame comprising an electrically insulative material, an opening in the electrically insulative material, and an electrical conductor extending through the electrically insulative material and attached to one or more metal pads at a first side of the PCB;
      a power stage module fixed in the opening in the electrically insulative material and comprising an output terminal at a side of the power stage module facing away from the PCB, and a power terminal, a ground terminal and a plurality of input/output (I/O) terminals at a side of the power stage module facing the PCB and attached to respective additional metal pads at the first side of the PCB; and a passive component attached to the power device at a side of the power device facing away from the PCB, the passive component comprising a first terminal attached to the output terminal of the power stage module and a second terminal attached to the electrical conductor of the frame so that the output terminal of the power stage module is electrically connected to the one or more metal pads at the first side of the PCB by the passive component and the electrical conductor of the frame, wherein the passive component has a larger footprint than the power stage module, wherein the frame expands the footprint of the power stage module to accommodate mounting of the passive component to the power device, wherein the frame has a lower interconnect density than the power stage module.

14. A method of manufacturing a power device, the method comprising:

forming a frame comprising an electrically insulative material, an opening in the electrically insulative material, and an electrical conductor extending through the electrically insulative material;

fixing a power stage module in the opening in the electrically insulative material, the power stage module comprising an output terminal at a first side of the power stage module, and a power terminal, a ground terminal and a plurality of input/output (I/O) terminals at a second side of the power stage module opposite the first side; and attaching a first terminal of a passive component to the output terminal of the power stage module and a second terminal of the passive component to the electrical conductor of the frame, wherein the passive component has a larger footprint than the power stage module, wherein the frame expands the footprint of the power stage module to accommodate mounting of the passive component to the power device, wherein the frame has a lower interconnect density than the power stage module.

15. The method of claim 14, wherein forming the frame comprises:

forming a first printed circuit board (PCB) having one or more plated through holes extending from a top surface of the first PCB to a bottom surface of the first PCB, the one or more plated through holes forming the electrical conductor of the frame, wherein the first PCB is devoid of metal traces running in a direction perpendicular to the top and the bottom surfaces of the first PCB.

16. The method of claim 15, wherein fixing the power stage module in the opening in the electrically insulative material comprises:

mounting the first PCB on a carrier;

mounting the power stage module on the carrier through the opening in the first PCB;

gluing, mechanically fixing or soldering the power stage module to the first PCB while the power stage module and the first PCB are mounted on the carrier; and after gluing, mechanically fixing or soldering the power stage module to the first PCB, removing the carrier from the power device.

17. The method of claim 14, wherein forming the frame and fixing the power stage module in the opening in the electrically insulative material comprises:

mounting a leadframe on a carrier, the leadframe having one or more leads which form the electrical conductor of the frame;

mounting the power stage module on the carrier and laterally spaced apart from the one or more leads of the leadframe;

embedding the one or more leads of the leadframe and the power stage module in a mold compound to form a molded package, wherein the one or more leads of leadframe and the terminals of the power stage module are not covered by the mold compound at both a top surface and a bottom surface of the molded package; and after forming the molded package, removing the carrier from the molded package.

18. The method of claim 14, wherein forming the frame and fixing the power stage module in the opening in the electrically insulative material comprises:

mounting a metal block on a carrier, the metal block forming the electrical conductor of the frame;

mounting the power stage module on the carrier and laterally spaced apart from the metal block;

embedding the metal block and the power stage module in a mold compound to form a molded package, wherein the metal block and the terminals of the power stage module are not covered by the mold compound at both a top surface and a bottom surface of the molded package; and after forming the molded package, removing the carrier from the molded package.

19. The method of claim 18, wherein the metal block is a copper block comprising copper or a copper alloy.

20. The method of claim 14, wherein fixing the power stage module in the opening in the electrically insulative material comprises:

embedding a first power transistor die, a second power transistor die and a driver die in a PCB and configured as a half bridge having a switched node output electrically connected to the output terminal of the power stage module; and fixing the PCB in the opening in the electrically insulative material, wherein the passive component is an inductor that electrically connects the switched node output to the electrical conductor of the frame.

* * * * *